United States Patent
Xin et al.

(10) Patent No.: US 9,280,416 B1
(45) Date of Patent: *Mar. 8, 2016

(54) SELECTION OF ERASURE CODE PARAMETERS FOR NO DATA REPAIR

(71) Applicant: EMC Corporation, Hopkinton, MA (US)

(72) Inventors: Qin Xin, Broken Arrow, OK (US); Feng Zhang, Sherborn, MA (US); Qi Bao, Boxborough, MA (US)

(73) Assignee: EMC Corporation, Hopkinton, MA (US)

( * ) Notice: Subject to any disclaimer, the term of this patent is extended or adjusted under 35 U.S.C. 154(b) by 150 days.

This patent is subject to a terminal disclaimer.

(21) Appl. No.: 14/168,478

(22) Filed: Jan. 30, 2014

Related U.S. Application Data

(63) Continuation of application No. 13/402,324, filed on Feb. 22, 2012, now Pat. No. 8,788,913.

(60) Provisional application No. 61/582,117, filed on Dec. 30, 2011.

(51) Int. Cl.
  *G06F 11/10* (2006.01)
(52) U.S. Cl.
  CPC .................. *G06F 11/1004* (2013.01)
(58) Field of Classification Search
  USPC ........................................................ 714/776
  See application file for complete search history.

(56) References Cited

U.S. PATENT DOCUMENTS

| 5,130,932 | A  | * | 7/1992  | Kaihara et al. | 700/97  |
|-----------|----|---|---------|----------------|---------|
| 7,346,734 | B2 | * | 3/2008  | Chen et al.    | 711/114 |
| 8,291,260 | B2 | * | 10/2012 | Vingralek      | 714/6.2 |
| 2004/0054939 | A1 | * | 3/2004 | Guha et al.   | 713/300 |
| 2008/0010499 | A1 | * | 1/2008 | Vingralek     | 714/6   |
| 2011/0055397 | A1 | * | 3/2011 | Dehaan        | 709/226 |
| 2012/0089729 | A1 | * | 4/2012 | Dehaan        | 709/224 |
| 2012/0102369 | A1 | * | 4/2012 | Hiltunen et al. | 714/48 |
| 2013/0054891 | A1 | * | 2/2013 | Kawaguchi     | 711/114 |

OTHER PUBLICATIONS

Aguilera et al., "Using Erasure Codes Efficiently for Storage in a Distributed Aystem", Proc. of the 2005 Int. Conf. on Dependable Systems and Networks (DSN'05), IEEE Computer Society, 2005.
Castro et al., "Topology-Aware Routing in Structured Peer-to-Peer Overlay Networks", A. Schiper et al. (Eds.), Future Directions in DC 2002, pp. 103-107, 2003.
Chang et al., "Bigtable: A Distributed Storage System for Structured Data", ACM. Trans. Comput. Syst. 26, 2, Article 4, Jun. 2008.

(Continued)

*Primary Examiner* — April Y Blair
*Assistant Examiner* — Thien D Nguyen
(74) *Attorney, Agent, or Firm* — BainwoodHuang

(57) ABSTRACT

An improved data storage technique achieves a desired level of reliability by providing sufficient redundancy in erasure coded data to maintain the data, without repair, for a prescribed period of time. The improved technique employs a newly devised, continuous-time Markov chain model. The model can be applied in computerized systems to establish erasure coding parameters for storing and reliably maintaining data for a designated period of time, without any need to repair the data to reestablish an original or previous level of erasure coding redundancy.

19 Claims, 3 Drawing Sheets

(56) References Cited

OTHER PUBLICATIONS

DeCandia et al., "Dynamo: Amazon's Highly Available Key-Value Store", SOSP'07, Oct. 14-17, 2007, Stevenson, Washington.
Dabek et al., "Designing a DHT for Low Latency and High Throughput", NSDI'04 Technical Paper, retrieved from http://static.usenix.org/events/nsdi04/tech/full_papers/dabek/dabek_html/ on Jul. 19, 2012.
Dabek et al., "Vivaldi: A Decentralized Network Coordinate System", SIGCOMM'04, Aug. 30-Sep. 3, 2004, Portland, Oregon.
Goodson et al., "Efficient Byzantine-Tolerant Erasure-Coded Storage", Proc. of the 2004 Int. Conference on Dependable Systems and Networks (DSN'04), IEEE Computer Society, 2004.
Greenan et al., "Reliability of XOR Based Erasure Codes on Heterogeneous Devices", International Conference on Dependable Systems and Networks, Anchorage, AK, pp. 147-156, Jun. 24-27, 2008.
Greenan, "Reliability and Power-Efficiency in Erasure-Coded Storage Systems", Technical Report UCSC-SSRC-09-08, University of California, Santa Cruz, Dec. 2009.
Hafner et al., "Notes on Reliability Models for Non-MDS Erasure Codes", IBM report, 2006.
Lakshman et al., "Cassandra—A Decentralized Structured Storage System", ACM SIGOPS Operating Systems Review, vol. 44, Issue 2, pp. 35-40, Apr. 2010.
Prasad et al. "Bandwidth Estimation: Metrics, Measurement Techniques, and Tools", IEEE Network, vol. 17, Issue 6, pp. 27-35, Nov./Dec. 2003.
Ratnasamy et al., "A Scalable Content-Addressable Network", SIGCOMM01, Aug. 27-31, 2001, San Diego, CA.
Rowstron et al., "Pastry: Scalable, Distributed Object Location and Routing for Large-Scale Peer-to-Peer Systems", R. Guerraoui (Ed.), Middleware 2001, pp. 329-350, 2001.
Stoica et al., "Chord: A Scalable Peer-to-Peer Lookup Service for Internet Applications", SIGCOMM'01, Aug. 27-31, 2001, San Diego, CA.
Weatherspoon, Hakim, "Design and Evaluation of Distributed Wide-Area On-line Archival Storage Systems", Appears in University of California, Berkeley PhD Dissertation, Technical Report No. UCB/EECS-2006-130, Oct. 13, 2006.
Weil et al., "CRUSH: Controlled, Scalable, Decentralized Placement of Replicated Data", SC2006, Nov. 2006, Tampa, FL.

\* cited by examiner

SELECTION OF ERASURE CODE PARAMETERS FOR NO DATA REPAIR

CROSS REFERENCE TO RELATED APPLICATIONS

This application is a continuation of U.S. application Ser. No. 13/402,324, filed Feb. 22, 2012, which claims the benefit under 35 U.S.C. §119(e) of U.S. Provisional Application Ser. No. 61/582,117 entitled "TECHNIQUES RELATING TO QUANTITATIVE SYSTEM RELIABILITY ANALYSIS," filed on Dec. 30, 2011, the contents and teachings of which are hereby incorporated by reference in their entirety.

BACKGROUND

Erasure coding has long been used to add redundancy to stored data and to facilitate recovery of data in the event of disk drive or other failures, which could lead to data loss. In a typical erasure coding scheme, a set of data, such as a file, is stored in the form of N fragments. Owing to redundancy built in to the fragments, however, only K of the N fragments are needed to completely recover the original set of data without errors. Up to N-K fragments can therefore be damaged and the set of data can still be recovered, as long as any K fragments remain. In some examples, K fragments store the original set of data and the remaining N-K fragments store parity information. In other examples, each fragment includes data and/or parity from at least one other fragment. Regardless of implementation, erasure coding schemes permit all of the original set of data to be recovered from any K fragments of the N fragments originally stored.

Theoretical models have been developed to predict the reliability of erasure coded data. See, for example, a PhD dissertation by Hakim Weatherspoon entitled, "Design and Evaluation of Distributed Wide-Area On-Line Archival Storage Systems (UC Berkeley, Technical Report No. UCB/EECS-2006-130, Oct. 13, 2006. See also "Notes on Reliability Models for Non-MDS Erasure Codes" by J. L. Hafner and K. Rao, IBM Report, 2006. These theoretical models employ continuous-time Markov chains to examine sequences of failures and repairs.

SUMMARY

Prior approaches for predicting the reliability of erasure coded data require damaged data to be repaired. As is known, repair of erasure-coded data involves regenerating any damaged fragments by applying an erasure coding algorithm to the undamaged fragments that remain. As long as at least K of the original N fragments remain undamaged, the damaged fragments can be regenerated from the remaining undamaged fragments to bring the total number of undamaged fragments back to the original number (i.e., N).

It has been recognized, however, that repair is not always desirable. For example, repair of erasure coded data involves significant computational overhead, as replacement fragments must be computed from remaining undamaged fragments. Also, where erasure coded fragments are stored at different locations on a network, as is often the case, repair can involve significant network traffic as codes are read from remaining intact fragments over the network and damaged fragments are copied back to designated locations. Therefore, data repair places a burden both on processors and on networks.

In addition, it has been recognized that data repair is not always necessary. For example, erasure coded data need not always be repaired in order to be kept reliably for a designated period of time. Indeed, it is not always necessary or desirable to keep all data indefinitely. For example, video surveillance data is generally only relevant for a few days, weeks, or months, after which it can be discarded if no need for access to the data arises.

In contrast with prior approaches that require repair in order to predict the reliability of stored data, an improved data storage technique achieves a desired level of reliability by providing sufficient erasure coding redundancy for maintaining data, without repair, for a prescribed period of time. A new model is introduced that includes a continuous-time Markov chain with no structural requirement for data repair. An equation is derived from the improved model for calculating a Mean Time to Data Loss, or "MTTDL," of the data, where MTTDL is defined as the time at which failures of individual data fragments accumulate, without repair, until a failure occurs that cannot be corrected by applying an erasure coding algorithm to remaining fragments. Data stored in accordance with this model are considered to be reliable as long as the MTTDL for the data is at least as long as a designated retention period. The improved model produces different results for MTTDL depending on the erasure coding parameters N and K that are used in storing the data. The erasure coding parameters N and K may therefore be varied to adjust the MTTDL to a point where it exceeds the designated retention period.

In accordance with certain embodiments, a method of managing storage of a set of data for a desired retention period includes calculating, by a set of processors executing instructions stored in memory of a computerized apparatus, a mean time to data loss (MTTDL) of a chunk of the set of data by applying a pair of erasure coding parameters, N and K, in an equation for MTTDL. N represents a total number of fragments for storing the chunk, and K represents a minimum number of the N fragments that are needed to ensure that the chunk can be recovered without data loss. The method further includes selecting, in response to the calculated MTTDL being at least as great as the desired retention period, erasure coding parameters N' and K' for performing an erasure coding operation on the chunk, wherein N' is at least as great as N and K' is at least as great as K.

Other embodiments are directed to computerized apparatus and computer program products. Some embodiments involve activity that is performed at a single location, while other embodiments involve activity that is distributed over a computerized environment (e.g., over a network).

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same parts throughout the different views. In the accompanying drawings.

DETAILED DESCRIPTION

An improved data storage technique achieves a desired level of reliability by providing sufficient redundancy in erasure coded data to maintain the data, without repair, for a prescribed period of time. The improved technique employs a newly devised, continuous-time Markov chain model. The model can be applied in computerized systems to establish erasure coding parameters for storing and reliably maintaining data for a designated period of time, without any need to repair the data to reestablish an original or previous level of erasure coding redundancy.

Figure 1:
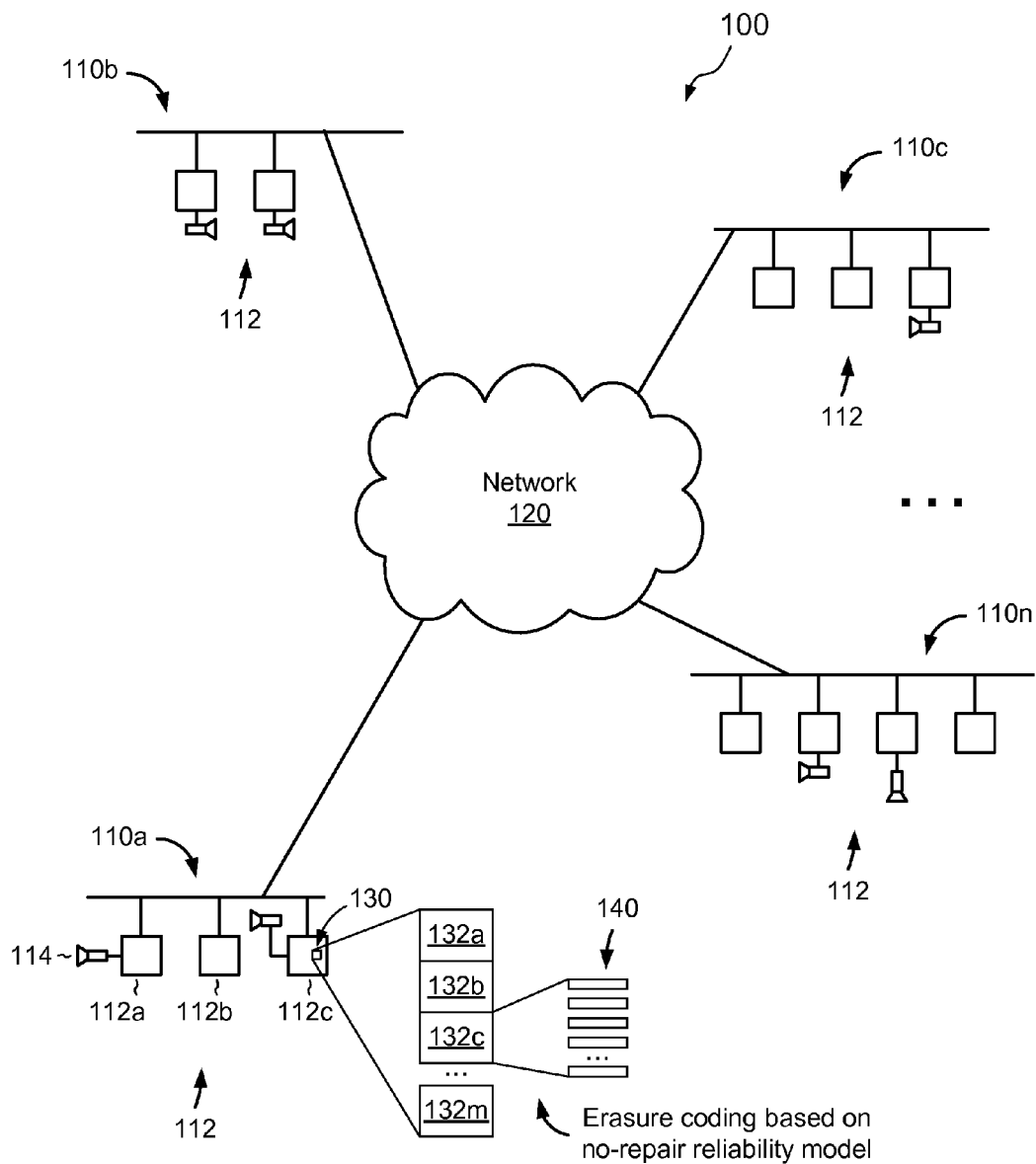
FIG. 1 is a simplified diagram of an example environment in which data storage techniques according to an improvement hereof may be conducted.

FIG. 1 shows an example computing environment 100 in which improved techniques for storing and maintaining data may be practiced. The environment 100 includes a number of local area networks (LANs) 110a-n. The LANs 110a-n are interconnected via a network 120. Each LAN 110a-n includes a number of computing nodes 112 (e.g., 112a-c on LAN 110a). Some of the computing nodes 112 may include a video camera 114. The video camera 114 of an example computing node 112c obtains a set of data 130, such as video data. In some examples, the set of data 130 may be provided in the form of a file or some other supply of data. The set of data 130 may be divided into chunks 132a-m, and each chunk may be erasure coded into a set of fragments 140. In general, N fragments are generated from each chunk 132a-m, of which a minimum of K fragments are required to completely recover the set of data 130. Therefore, up to N-K of the fragments 140 may be damaged without compromising the set of data 130. In the example environment 100, the erasure coding parameters N and K are established using an improved technique that ensures data reliability within a designated retention period without the need for data repair. The fragments 140 may be stored in any suitable way. In some arrangements, data fragments 140 are stored in the environment 100 in a distributed fashion, wherein the N data fragments 140 are stored on N different computing nodes 112. In other arrangements, the N data fragments 140 are stored on fewer than N nodes of the network 140, are stored locally on the computing node where the data are generated, or are stored both on the computing node where the data are generated and on other computing nodes 112 of the network.

It is understood that computing nodes 112 need not belong to any of the particular LANs 110a-n or to any LAN, and may connect to other computing nodes 112 directly or through the network 120. The network 120 can itself be any type of network, including a LAN, a wide area network (WAN), the Internet, a cell phone network, a data network, a satellite network, or any combination of these, for example. The computing nodes 112 may be provided in any suitable form, such as using servers, laptop computers, desktop computers, tablets, smart phones, PDA's, or any combination of these, for example. Different computing nodes 112 may be provided in different forms. For example, some computing nodes 112 may include video cameras but little data storage, whereas other computing nodes 112 may include large storage arrays. Still others may include high performance processors. It is therefore understood that the environment 100 may include diverse types of computing nodes 112.

In some examples, the environment 100 is part of an overlay network. The overlay network may be provided as a hierarchical cluster tree, wherein LANs form the lowest level clusters. Higher order clusters consist of multiple LANs grouped based on proximity (e.g., number of hops returned using a traceroute function). Each cluster has a proximity requirement, with lower-order clusters including only clusters whose LANs are physically close to one another and higher-order clusters containing clusters whose LANs are more physically distant from one another. The resulting hierarchical cluster tree provides an overlay to an existing network (e.g., the Internet). As its organization is based on physical proximity, the hierarchical cluster tree, of which the environment 100 may be a part, allows for particularly efficient distributed storage and retrieval of data.

Figure 2:
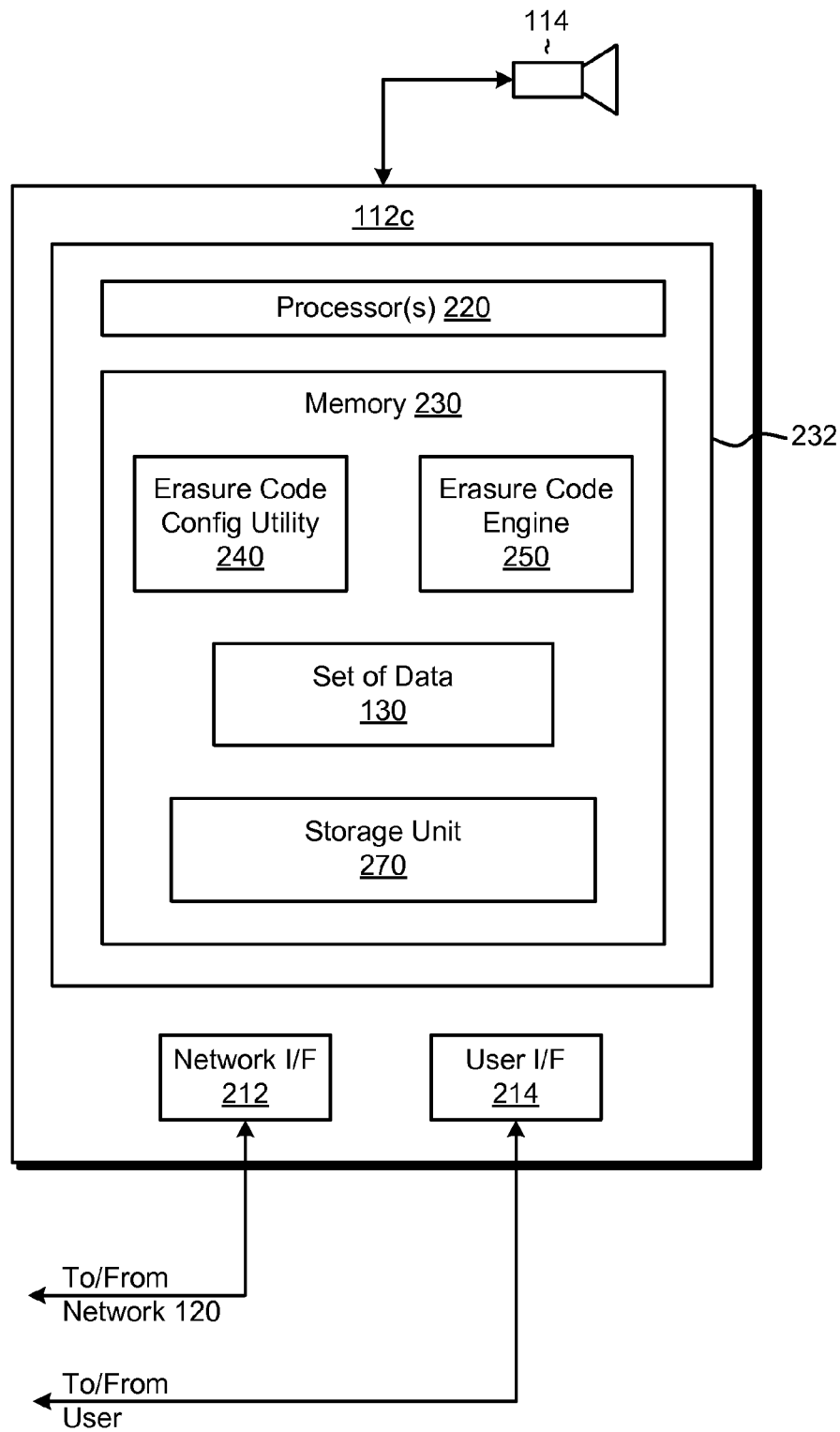
FIG. 2 is a block diagram of an example computing apparatus of the environment of FIG. 1.

FIG. 2 shows the computing node 112c of FIG. 1 in greater detail. The characteristics of the computing node 112c may be common to many of the computing nodes 112; however, it is expected that the details of different computing nodes 112 may differ. As shown, the computing node 112c is a computerized apparatus that includes a set of processors 220 (e.g., one or more processing chips and/or assemblies), memory 230, including both volatile and non-volatile memory, a network interface 212 for connecting the computing node 112c to the network 120, and a user interface 214 for interacting with a user. The set of processors 220 and the memory 230 together form a specialized circuit 232, which is constructed and arranged to perform functions and methods as described herein.

The memory 230 includes an operating system, programs, and other software constructs and data. Of particular relevance, the memory 230 includes an erasure code configuration utility 240, an erasure code engine 250, the set of data 130, such as video data acquired from the video camera 114, and a storage unit 270, such as a disk drive or other non-volatile storage device or set of devices. The erasure code configuration utility 240 includes instructions for establishing erasure code parameters (i.e., N and K) to meet various criteria, such as reliability over a designated retention period without data repair. The erasure code engine 250 applies the erasure code parameters to perform erasure coding on chunks 132a-m of the set of data 130.

In some examples, the erasure code configuration utility 240 is provided on a different computing node 112 of the network 120 or even on a computing node that is not part of the network 120. There is no requirement, therefore, that the erasure code configuration utility 240 and the erasure code engine 250 be provided on the same computing node 112. Similarly, there is no requirement that the erasure code engine 250 be provided on the same computing node 112 that collects the video data 130. For example, the video data 130 could be collected on one computing node 112 and copied to another node 112, where an erasure code engine 250 processes the video data into fragments. The details of the computing node 112c should therefore be viewed as merely illustrative.

Figure 3:
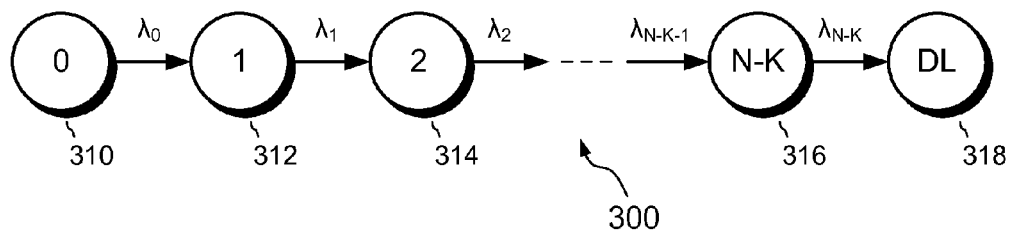
FIG. 3 is a state transition diagram of an example time-variant Markov chain model according to an improvement hereof.

FIG. 3 shows an example continuous-time, Markov chain model 300 according to an improvement hereof. The model 300 can be used to predict the reliability of erasure coded data and forms a basis for the erasure code configuration utility 240 to establish erasure code parameters.

The model 300 depicts a number of states, as indicated by the circles 310, 312, 314, 316, and 318. Additional states may be provided. The different states represent different numbers of failed erasure coded fragments for a set of data, from a state 0 (310), which indicates no failures, to a state DL (318), which indicates data loss. The state preceding the DL state, N-K (316), indicates a failure of the last redundant erasure code fragment. Any subsequent failures (i.e., DL and beyond) therefore represent failures for which erasure coding cannot completely recover the original set of data.

Transitions from one state to another occur at particular rates, designated as $\lambda_0$ to $\lambda_{N-K}$, which each represent a number of failures per unit time. Therefore, failure of a first erasure code fragment for a set of data (i.e., a transition from state 0 to state 1) occurs at a rate $\lambda_0$, failure of the second erasure code fragment (i.e., a transition from state 1 to state 2) occurs at rate $\lambda_1$, and so forth. In general, the failure rate $\lambda_i$ for a transition from state i to state i+1 can be designated as follows:

$$\lambda_i = d - i / MTTF, \text{ where i ranges from 0 to N-K.}$$

Here, d represents the number of disks (or other storage units) used to store the N fragments and MTTF represents the mean time to failure of each disk, which may be provided, for example, by the disk manufacturer or by observations of field failures. In a typical scenario, each erasure coded fragment is stored on a different disk, such that d equals N. However, this is not required. For example, certain disks can be used to store multiple fragments, in which case d would be less than N.

From the model 300, one can compute a mean time to data loss, or "MTTDL," which represents the average time required to make all of the transitions from state 0 to state DL, i.e., to go from an initial state in which all erasure coded fragments are error-free to a state in which all redundant erasure code fragments (i.e., all N-K of them) have failed, plus one additional fragment has failed, which reflects a loss of information from which erasure coding cannot recover. MTTDL may be computed from the following equation:

$$MTTDL = \sum_{i=0}^{N-K} \frac{1}{\lambda_i} = \sum_{i=0}^{N-K} \frac{MTTF}{d-i} \qquad \text{EQ. 1}$$

It is understood that MTTDL is a significant system reliability metric, as it represents the mean time until data loss occurs in a set of data that is erasure coded and stored in a distributed manner across multiple disks. In some examples, these disks may be located on multiple computing nodes 112 of the network 120. For instance, the number of disks d may be equal to the number N of erasure code fragments and the disks may be distributed across N different computing nodes 112.

Of note, transitions between states in the model 300 are seen to proceed in a single direction from lower states to higher states. For example, the model 300 proceeds from state 0 to state 1, then from state 1 to state 2, and so forth. There are no provisions in the illustrated model 300, however, for transitioning from a higher state to a lower state. For example, the system is not configured to allow a transition from state 2 back to state 1. Such a transition, if present, would represent the repair of a damaged erasure code fragment to restore a previous level of redundancy. Typical embodiments hereof exclude this possibility for repair, which has been found to be costly both in terms of processing overhead and network traffic, and instead rely upon the built-in redundancy that erasure coding affords to ensure high reliability over a designated period of time.

As indicated, the model 300 forms a basis for developing an equation for MTTDL. The equation can be used in a process for establishing erasure code parameters to meet a desired reliability goal for a set of data over a designated period of time.

Figure 4:
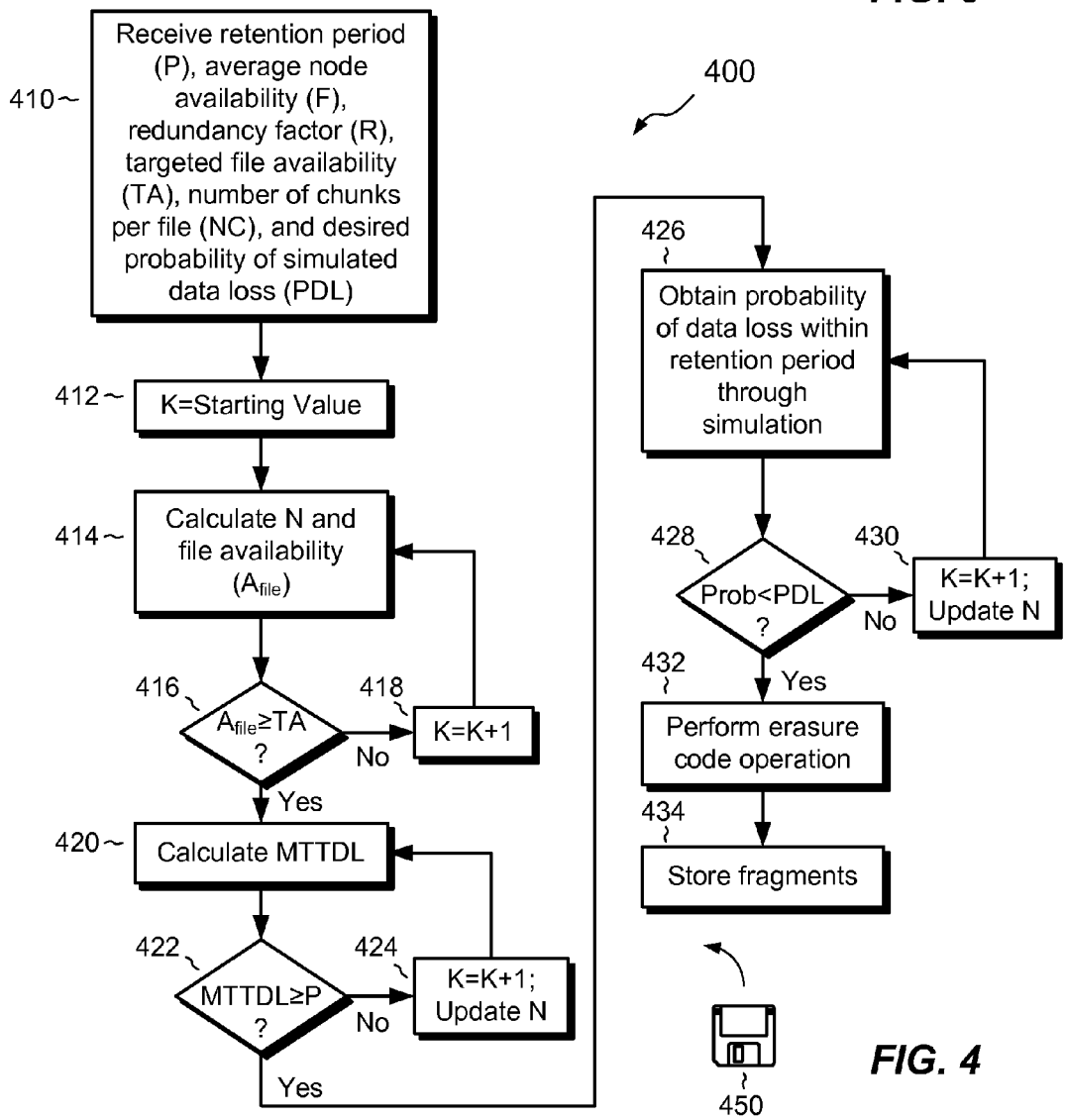
FIG. 4 is a flow chart showing an example process for determining erasure code parameters for data storage using the time-variant Markov chain model of FIG. 3.

FIG. 4 shows a process 400 for storing a set of data in accordance with the model 300 and using the above-described equation for MTTDL. The process of FIG. 4 may be conducted, for example, by a processing node 112, using the set of video data 130 acquired from a video camera 114. The set of video data 130 may be provided in the form of a file, where the file is divided into a number of chunks and where each chunk includes an amount of data on which erasure coding can be efficiently performed. The illustrated process identifies minimum values of N and K that meet various requirements.

At step 410, a variety of input values are received. These include a desired data retention period (P) and a desired redundancy factor (R). The retention period (P) designates a desired period of time over which the set of data is sought to be reliably maintained, without the need for repair. The redundancy factor (R) designates a desired ratio of erasure code parameters N and K; i.e., R=N/K. The redundancy factor (R) is a significant data storage metric, as it specifies a level of storage overhead required for the set of data, which drives both storage and network traffic requirements. Since N and K are typically integers, the redundancy factor (R) assumes discrete values that depend on individual values of N and K. R is therefore typically specified as a range of values or as a minimum value to be exceeded by no more than is necessary for providing N and K as integers.

Inputs are also received at step 410 for an average node availability (F), a targeted file availability (TA), a number of chunks per file (NC), and an acceptable probability of data loss (PDL) during the retention period. The average node availability (F) represents the percentage of time, on the average, that computing nodes 112 used to store fragments of the set of data are available for use. The targeted file availability (TA) represents a desired level of availability of the file being stored, and the number of chunks per file (NC) represents the number of chunks into which a file is divided.

At step 412, a starting value of K is assigned. The starting value of K is selected as a value that is certain to be less than or equal to the smallest value of K that satisfies all process requirements. Accordingly, the starting value of K can be set to 1 or to some other minimum value.

At step 414, a value of N is computed based on the current value of K and the redundancy factor (R). For example, N can be assigned the first integer value greater than or equal to K*R. Also at step 414, actual file availability is estimated. In one example, file availability is estimated based on the availability of chunks that make up the file. Availability of each chunk is calculated using the following conventional equation:

$$A_{chunk} = \sum_{i=K}^{N} \binom{N}{i} F^i (1-F)^{N-i}, \qquad \text{EQ. 2}$$

where F is the received value for average node availability, i is an index, and K and N are current erasure code parameters. The notation $$\binom{N}{i}$$

represents the number of i-sized combinations in a set of N elements, which can also be expressed as $$\frac{N!}{i!(N-i)!}.$$

With the availability of a chunk established, the availability of the file containing NC chunks is calculated as:

$$A_{file} = (A_{chunk})^{NC}. \qquad \text{EQ. 3}$$

At step 416, the process 400 tests whether the estimated file availability $A_{file}$ meets the input requirement for targeted file availability (TA). If so, control continues to step 420. However, if the $A_{file}$ is less than TA, K is incremented and control returns to step 414. N is recomputed, based on the new value of K, and $A_{file}$ is estimated again. The value of K continues to be incremented, and N and $A_{file}$ continue to be recomputed, until $A_{file}$ meets or exceeds the targeted file availability (TA).

The process 400 next calculates MTTDL (step 420) using EQ. 1 and tests whether the calculated MTTDL meets or exceeds the desired retention period P (step 422). If so, control may proceed to step 426. Otherwise, K is incremented and N is updated, e.g., set to the first integer greater than or equal to K*R, (step 424). Also, MTTDL is recalculated (step 420) and tested once again against the designated retention period (P) (step 422). Control remains in the loop 420, 422, 424 until a sufficiently large value of K is applied for which MTTDL meets or exceeds the designated retention period (P). Control may then continue to step 426.

At step 426, a simulation is run to verify system reliability. Various simulators are available for data storage devices and systems. One such simulator is disclosed in "Reliability and Power-Efficiency in Erasure-Coded Storage Systems," by Kevin Greenan, Technical Report UCSC-SSRC-09-08, December 2009. The simulator described in the cited document has been modified by the inventors hereof to provide for a desired retention period and to add a feature that prohibits data from being repaired. In one example, the modified simulator is run multiple times (e.g., 10,000 times, although any suitable number may be used), with each iteration simulating the behavior of a distributed data storage system over the entire data retention period (P). Given the number of simulation runs and the number of data loss events (if any) that occur during those simulations, a probability of simulated data loss (Prob) can be computed as the number of data loss events divided by the number of simulator runs. For example, if the data storage simulator is run 10,000 times and the simulator indicates a data loss event on one simulation run, then the probability of data loss (Prob) would be one in 10,000, or 0.01%.

At step 428, the simulated probability of data loss (Prob) is compared with the received acceptable probability of data loss (PDL). If Prob is greater than or equal to PDL, the value of K is incremented and N is updated (step 430). The simulation can then be re-run another 10,000 times with updated values of K and N, with the steps 426, 428, and 430 repeated until a value of K is attempted for which Prob becomes less than PDL.

With the requirements for retention period (P), targeted file availability (TA), and simulation all satisfied, final erasure code parameters N' and K' are established, which may then be applied in performing an erasure coding operation on each of the chunks that make up the file (step 432). The erasure coded fragments can then be stored (step 434).

In some examples, the erasure code parameters N' and K' are established by the erasure code configuration utility 140. Also, the erasure coding of the video data 130 are performed by the erasure code engine 250. Fragments are stored in the storage unit 270 and/or on storage units 270 of other computing nodes 112 of the network 120.

It is understood that the process 400 is typically performed by the software constructs described in connection with FIGS. 1 and 2, which reside in the memory 230 of a computing node 112 and are run by a set of processors 220. The various acts of the process 400 may be ordered in any suitable way. Accordingly, embodiments may be constructed in which acts are performed in orders different from those illustrated, which may include performing some acts simultaneously, even though the acts are shown as sequential in the illustrated embodiments.

For example, there is no requirement that all input values be received in a single act (e.g., at step 410). Rather, input values can be received in the order the process 400 requires them, or in some other order, rather than all at once at the start of the process. Also, it is seen that the process 400 includes three main portions: (1) ensuring that the requirement for targeted file availability (TA) is met; (2) ensuring that calculated MTTDL is at least as great as the designated retention period (P); and (3) ensuring that simulated reliability meets a predefined criterion (e.g., 10,000 iterations with no failures). It is understood, however, that the order of portions 1-3 can be varied in any desired way. For example, MTTDL can be calculated and tested before file availability, and simulation can be run before any of the other portions. It is observed, however, that simulation is much more time consuming than either of the other portions and is thus preferably performed last to avoid unnecessary iterations. In some examples, fewer than all three of the identified portions of the process 400 are used. For example, the process 400 may be limited in some cases only to ensuring that targeted file availability (TA) is satisfied (portion 1). In other cases, the process may be limited only to ensuring that MTTDL meets or exceeds the designated retention period (P) (portion 2). In still other cases, the process 400 is limited only to ensuring that multiple runs of a simulator confirm a desired level of reliability (portion 3). In still other examples, only two of the three portions are run.

In some examples, simulations are pre-run for a number of test cases involving different values of N and K. Results of multiple runs (e.g., 10,000 runs each) are stored along with N and K in a table. The table can then be accessed when the process 400 is conducted to determine whether current values of N and K meet the requirements for reliability, without the need actually to run the simulation each time.

It is understood that the process 400 can be conducted by various entities. In some examples, the process 400 is conducted entirely by the computing node 112 that collects video data 130. In other examples, part or all of the process 400 is performed by an administrative computer or by a set of computers on the network 120 that perform administrative and/or data processing functions. It is understood, therefore, that the disclosed process 400 is therefore merely illustrative.

An improved data storage process 400 has been presented for achieving a desired level of reliability by providing sufficient redundancy in erasure coded data to maintain the data, without repair, for a prescribed retention period (P). The improved technique employs a newly devised, continuous-time Markov chain model 300. The model 300 can be applied in computerized systems to establish erasure coding parameters (N and K) for storing and reliably maintaining data for a designated period of time, without any need to repair the data to reestablish an original or previous level of erasure coding redundancy. In some examples, the process 400 can make provisions to further adjust erasure code parameters to achieve a desired level of file availability and/or to meet reliability criteria verified by simulation.

As used throughout this document, the words "comprising," "including," and "having" are intended to set forth certain items, steps, elements, or aspects of something in an open-ended fashion. Although certain embodiments are disclosed herein, it is understood that these are provided by way of example only and the invention is not limited to these particular embodiments.

Having described one embodiment, numerous alternative embodiments or variations can be made. For example, the set of data on which the process 400 operates has been described as video data. However, this is merely an example. The process 400 can be applied equally well to other types of data.

In addition, the set of data has been described herein as a file. The file is divided into chunks, and the chunks are erasure coded into fragments. Alternatively, the set of data is provided in other forms, including a stream, such as a stream of video content. In this example, the streaming data can be collected in different chunks, which are each erasure coded into multiple fragments.

Also, as shown and described, the set of data 130 is divided into multiple chunks 132a-m. This is not required, however. For example, erasure coding can be performed on a single chunk, which represents an entire file or other source of data.

Further still, the improvement or portions thereof may be embodied as a non-transient computer-readable storage medium, such as a magnetic disk, magnetic tape, compact disk, DVD, optical disk, flash memory, Application Specific Integrated Circuit (ASIC), Field Programmable Gate Array (FPGA), and the like (shown by way of example as medium 450 in FIG. 4). Multiple computer-readable media may be used. The medium (or media) may be encoded with instructions which, when executed on one or more computers or other processors, perform methods that implement the various processes described herein. Such medium (or media) may be considered an article of manufacture or a machine, and may be transportable from one machine to another.

Those skilled in the art will therefore understand that various changes in form and detail may be made to the embodiments disclosed herein without departing from the scope of the invention.

What is claimed is:

1. A method of managing storage of a set of data for a desired retention period, comprising:
    calculating, by a set of processors executing instructions stored in memory of a computerized apparatus, a mean time to data loss (MTTDL) of a chunk of the set of data by applying a pair of erasure coding parameters, N and K, in an equation for MTTDL, wherein N represents a total number of fragments for storing the chunk and K represents a minimum number of the N fragments that are needed to ensure that the chunk can be recovered without data loss;
    selecting, in response to the calculated MTTDL being at least as great as the desired retention period, erasure coding parameters N' and K' for performing an erasure coding operation on the chunk;
    storing the chunk in memory of a computing node distinct the computerized apparatus; and
    performing, by a set of processors of the computing node, an erasure coding operation on the chunk using erasure coding parameters N' and K',
    wherein N' is at least as great as N, and
    wherein K' is at least as great as K.

2. The method of claim 1, further comprising storing the N' fragments in multiple storage units, the storage units including at least one storage unit accessible to the computing node over a network.

3. The method as recited in claim 2, wherein the multiple storage units include N' storage units, one for each fragment, wherein each of the N' storage units resides on a different computing node of the network.

4. The method of claim 1, wherein calculating the MTTDL includes calculating different values of MTTDL for different value pairs of N and K until a calculation of MTTDL for a value pair of N and K produces an MTTDL that is at least as great as the desired retention period.

5. The method of claim 4, further comprising, prior to calculating the MTTDL:
    receiving a designated redundancy factor (R);
    choosing a starting value of K; and
    calculating an accompanying value of N that meets the designated redundancy factor (R), wherein calculating the accompanying value of N includes assigning N to be the first integer that is at least as great as K*R.

6. The method of claim 5, wherein calculating MTTDL applies a starting value of K for a first calculation of the MTTDL and an increasing value of K for each successive calculation of MTTDL.

7. The method of claim 6, wherein K is incremented by one on each successive calculation of MTTDL to ensure that the value pair of N and K for which MTTDL is calculated to be at least as great as the desired retention period to provide the minimum value of K for which MTTDL is at least as great as the desired retention period.

8. The method of claim 4, wherein calculating the MTTDL includes applying an equation for a continuous-time Markov chain model having multiple states each indicating a number of failures ranging from zero to N−K+1, wherein the continuous-time Markov chain model prohibits damaged fragments from being repaired, and wherein each failure of a fragment represented by the continuous-time Markov chain model reduces the number of undamaged fragments until only K−1 undamaged fragments remain.

9. The method as recited in claim 1, further comprising, prior to the selecting erasure coding parameters N' and K' for performing an erasure coding operation on the chunk:
    running a data storage simulator multiple times using the value pair of N and K which produce an MTTDL that is at least as great as the desired retention period, to determine whether the simulator indicates that data loss occurs within a predefined number of iterations of the data storage simulator; and
    increasing K responsive to the simulator indicating that data loss occurs within the predetermined number of iterations of the data storage simulator.

10. A computerized apparatus for managing storage of a set of data for a desired retention period, the computerized apparatus comprising:
    a set of processors; and
    memory, coupled to the set of processors, the memory arranged to store instructions executable by the set of processors,
    wherein the set of processors executing instructions from the memory forms a specialized circuit arranged to:
        calculate, by a set of processors executing instructions stored in memory of a computerized apparatus, a mean time to data loss (MTTDL) of a chunk of the set of data by applying a pair of erasure coding parameters, N and K, in an equation for MTTDL, wherein N represents a total number of fragments for storing the chunk and K represents a minimum number of the N fragments that are needed to ensure that the chunk can be recovered without data loss;

select, in response to the calculated MTTDL being at least as great as the desired retention period, erasure coding parameters N' and K' for performing an erasure coding operation on the chunk;

direct the chunk to be stored in memo of a co u in node distinct from the computerized apparatus; and direct a set of processors of the computing node to perform an erasure coding operation on the chunk using erasure coding parameters N' and K', wherein N' is at least as great as N, and wherein K' is at least as great as K.

11. The computerized apparatus of claim 10, wherein the specialized circuit is arranged to calculate different values of MTTDL for different value pairs of N and K until a calculation of MTTDL for a value pair of N and K produces an MTTDL that is at least as great as the desired retention period.

12. The computerized apparatus of claim 11, wherein the specialized circuit is further arranged to:

receive a designated redundancy factor (R);

choose a starting value of K; and calculate an accompanying value of N that meets the designated redundancy factor (R), to assign N to be the first integer that is at least as great as K*R.

13. The computerized apparatus of claim 12, wherein the specialized circuit is further arranged to apply a starting value of K for a first calculation of the MTTDL and an increasing value of K for each successive calculation of MTTDL.

14. The computerized apparatus as recited in claim 13, wherein the specialized circuit is further arranged to compute MTTDL using the following equation:

$$MTTDL = \sum_{i=0}^{N-K} \frac{MTTF}{d-i},$$

wherein i is an index, N and K are currently selected erasure code parameters, MTTF is the mean time to failure of disks used to store the chunk, and d is the number of disks on which it is considered that the "N" fragments are to be stored.

15. A computer program product including a non-transitory computer-readable medium having instructions which, when executed by a set of processors of a computerized apparatus, cause the set of processors to perform a method managing storage of a set of data for a desired retention period, the method comprising:

calculating, by a set of processors executing instructions stored in memory of a computerized apparatus, a mean time to data loss (MTTDL) of a chunk of the set of data by applying a pair of erasure coding parameters, N and K, in an equation for MTTDL, wherein N represents a total number of fragments for storing the chunk and K represents a minimum number of the N fragments that are needed to ensure that the chunk can be recovered without data loss; and selecting, in response to the calculated MTTDL being at least as great as the desired retention period, erasure coding parameters N' and K' for performing an erasure coding operation on the chunk;

directing the chunk to be stored in memos of a computing node distinct from the computerized apparatus; and directing a set of processors of the computing node to perform an erasure coding operation on the chunk using erasure coding parameters N' and K', wherein N' is at least as great as N, and wherein K' is at least as great as K.

16. The computer program product of claim 15, wherein calculating the MTTDL includes calculating different values of MTTDL for different value pairs of N and K until a calculation of MTTDL for a value pair of N and K produces an MTTDL that is at least as great as the desired retention period.

17. The computer program product of claim 15, wherein the set of data includes a file, and wherein the method further comprises increasing a current value pair of N and K in response to initial values of N and K being insufficient to meet a desired level of availability of the file.

18. The computer program product of claim 17, wherein the file includes the at least one chunk and wherein the method further comprises computing the availability of the file using the following equation:

$$A_{file} = (A_{chunk})^{NC}, \text{ for which } A_{chunk} = \sum_{i=K}^{N} \binom{N}{i} F^i (1-F)^{N-i},$$

wherein $A_{file}$ is the availability of the file, $A_{chunk}$ is the availability of each chunk of the file, NC is the number of chunks that make up the file, F is the average availability of each computing node on which a fragment is stored, N and K are currently selected erasure code parameters, and i is an index.

19. The computer program product of claim 17, wherein a value of K is first identified to meet the desired file availability and later increased until the calculated MTTDL meets the designated retention period.

* * * * *